(12) United States Patent
Cho et al.

(10) Patent No.: US 6,168,427 B1
(45) Date of Patent: Jan. 2, 2001

(54) APPARATUS FOR GUIDING THE REMOVAL OF A PROCESSING TUBE FROM A SEMICONDUCTOR FURNACE

(75) Inventors: Guey-Shyung Cho, Hsin-Chu; Yi-Jen Chen, Hsinshih Tainan, both of (TW)

(73) Assignee: Taiwan Semiconductor Manufacturing Co., Ltd, Hsin Chu (TW)

( * ) Notice: Under 35 U.S.C. 154(b), the term of this patent shall be extended for 0 days.

(21) Appl. No.: 09/412,227

(22) Filed: Oct. 5, 1999

(51) Int. Cl.[7] .................................................. F27D 3/12
(52) U.S. Cl. ......................... 432/241; 432/56; 432/239; 118/725; 118/728; 414/935; 414/937
(58) Field of Search ..................... 432/56, 239, 241; 219/390, 402, 403, 404; 392/416, 418; 118/725, 728; 414/935, 936, 937, 938

(56) References Cited

U.S. PATENT DOCUMENTS

| 4,781,511 | * | 11/1988 | Harada et al. | 414/935 |
| 5,000,682 | * | 3/1991 | Heidt et al. | 432/56 |
| 5,676,869 | * | 10/1997 | Nakayama et al. | 219/390 |

* cited by examiner

Primary Examiner—Denise L. Ferensic
Assistant Examiner—Gregory A. Wilson
(74) Attorney, Agent, or Firm—Tung & Associates

(57) ABSTRACT

A processing chamber tube used in a semiconductor furnace is guided during its removal from the furnace by a plurality of circumferentially spaced guides. The guides are mounted for adjustable radial movement on a ring-shaped plate. The plate is secured on the base of the furnace. The guides are preferably in the form of rollers which engage and guide the tube during its removal from the furnace.

18 Claims, 4 Drawing Sheets

APPARATUS FOR GUIDING THE REMOVAL OF A PROCESSING TUBE FROM A SEMICONDUCTOR FURNACE

TECHNICAL FIELD

The present invention broadly relates to equipment for manufacturing semiconductor devices, such as integrated circuits, and deals more particularly with apparatus for aiding in the removal of a fragile processing tube from a semiconductor furnace.

BACKGROUND OF THE INVENTION

In connection with processes used to manufacture semiconductor devices, such as integrated circuits, numerous process steps are carried out in a controlled environment at elevated temperatures. Such processes includes oxidation, diffusion, chemical vapor deposition and annealing. In order to realize elevated processing temperatures, semiconductor wafers are processed in an evacuated chamber, typically in a form of a quartz tube which is housed within a semiconductor furnace.

The most common type of semiconductor furnace is of the so-called "hot wall" electric type which facilitates batch processing of semiconductor wafers. Furthermore, hot wall electric furnaces exhibit excellent temperature stability and precise temperature control. Modern hot wall diffusion furnaces are capable of controlling temperatures over the range of 300°–1200° C. to an accuracy of 0.5° or –0.5° C. Hot wall furnaces were initially designed as horizontal diffusion furnaces, however, more recently, vertical furnaces have gained favor because they present a number of advantages over their horizontal predecessors. These advantages include: elimination of cantilever or soft-landing since the wafers are held in a quartz boat which does not touch the process tube walls; wafers can be loaded and unloaded automatically; and, the clean room footprint of the system is somewhat smaller than that of the conventional horizontal configuration.

Vertical semiconductor furnaces of the type mentioned above employ a quartz tube which typically has a polysilicon coating when used for a deposition or annealing process. The polysilicon deposition reduces the power loss due to quartz reflection or radiation, and reduces the degradation of a boat occasioned by wet etching.

Because semiconductor furnaces are subjected to high rates of usage and their components are exposed to harsh operating environments, periodic maintenance must be performed on various furnace components, including the quartz tube assembly. In the past, in order to remove a quartz tube from the furnace for repair or maintenance, a technician would draw the tube from the bottom of the furnace. This removal process was sometimes accomplished by using a mechanical arm, but even with the aid of such mechanical devices, tube removal was tedious because of the tight clearance between the outer walls of the tube, and the inside wall of the furnace. Consequently, as the technician attempted to withdraw the tube from the furnace, the fragile tube often came in contact with the sidewall or edges of the furnace, resulting in breakage of the tube. Tube breakage results in the additional expense of replacing the tube as well as downtime of equipment. Moreover, tube breakage, especially when the tube remains hot, presents a risk of injury to the technician handling the tube removal.

Accordingly, there is a clear need in the art for tools or equipment that facilitate the removal of the quartz tube from the furnace that preclude or substantially reduce the possibility of the tube coming in contact with the sidewalls of the furnace during the removal process. The present invention is directed toward satisfying this need.

SUMMARY OF THE INVENTION

According to one aspect of the invention, apparatus is provided for aiding in the removal of a tube from a surrounding furnace, wherein the furnace includes a cylindrical body surrounding the tube and an open end at the bottom thereof through which the tube may be removed. The apparatus includes a plurality of circumferentially spaced guides, and means for mounting the guides on the base of the furnace body such that the guides are provided with radial adjustment so that they may be moved into contact with the sidewalls of the tube during withdrawal, and thereby guide the withdrawal of the tube to prevent contact with the furnace body. The guide mounting means includes a plate, means for securing the plate on the base of the furnace body, and slide means for slidably mounting the guides for radial adjustment. The guides are preferably in the form of Teflon coated wheels mounted on the inner extremities of the slides. The plate is ring-shaped and may comprise first and second portions coupled together by a tongue and groove interconnection.

It is therefore a primary object of the present invention to provide apparatus for aiding and the removal of a fragile procesing tube from a semiconductor furnace which reduces the possibility of tube breakage due to contact with the walls of the furnace.

Another object of the invention is to provide apparatus as described above which is especially simple in construction and may be retrofitted to existing furnaces.

A further object of the present invention is to provide apparatus of the type mentioned above which may be permanently mounted on the furnace, but yet which does not interfere with normal furnace operation.

A still further object of the present invention is to provide apparatus as described above which positively engages the sidewalls of the tube so as to maintain the tube coaxial with the longitudinal axis of the furnace body, but yet which does not damage the tube.

These, and further objects and advantages of the present invention will be made clear or will become apparent during the course of the following description of a preferred embodiment of the invention.

BRIEF DESCRIPTION OF DRAWINGS

In the drawings, which form an integral part of the specification and are to be read in conjunction therewith, and in which like referenced numerals are employed to designate identical components of the various views.

DESCRIPTION OF THE PREFERRED EMBODIMENT

Figure 1:
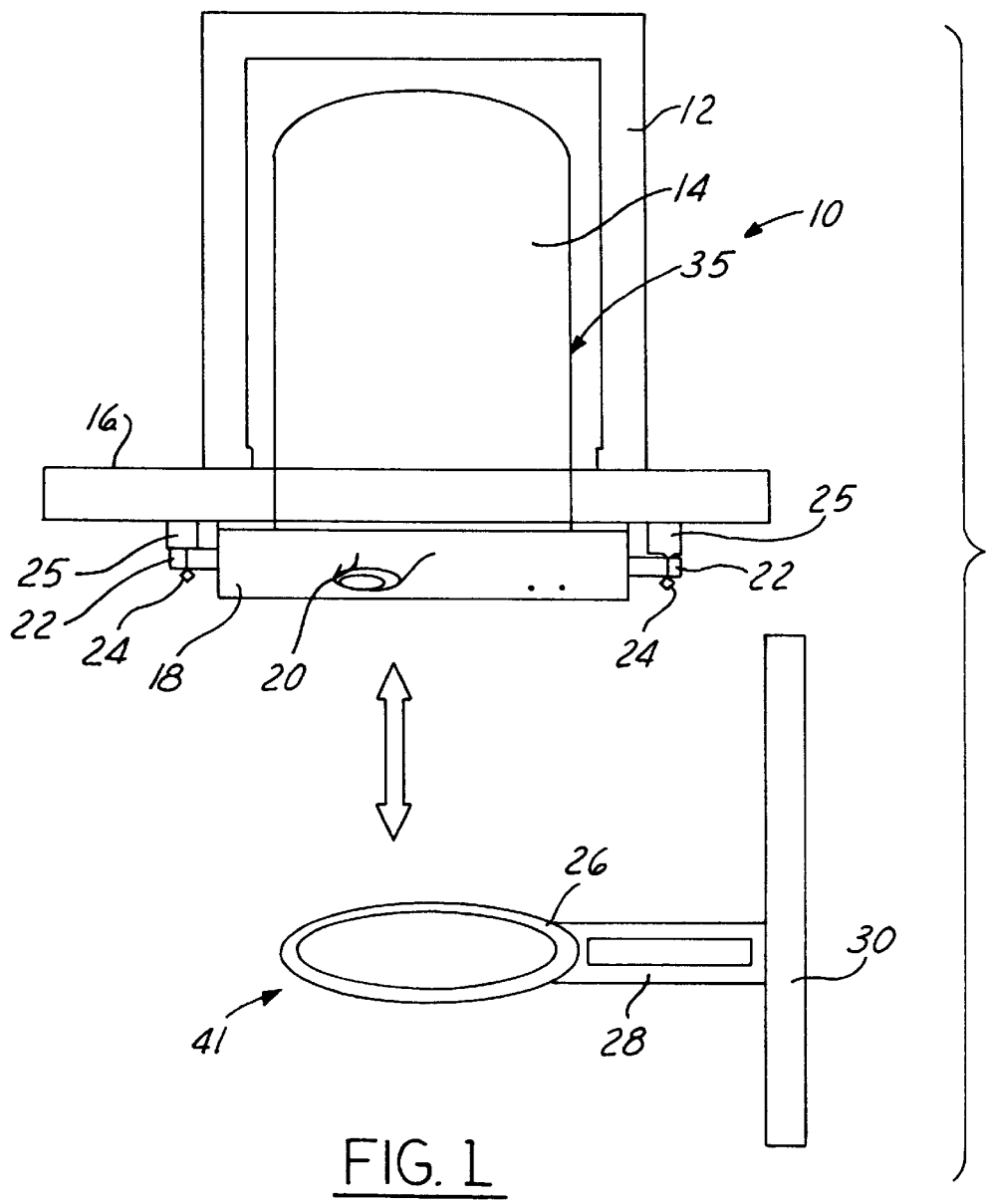
FIG. 1 is a side view of a semiconductor furnace and related boat elevator suitable for use with the apparatus with the present invention.
Figure 2:
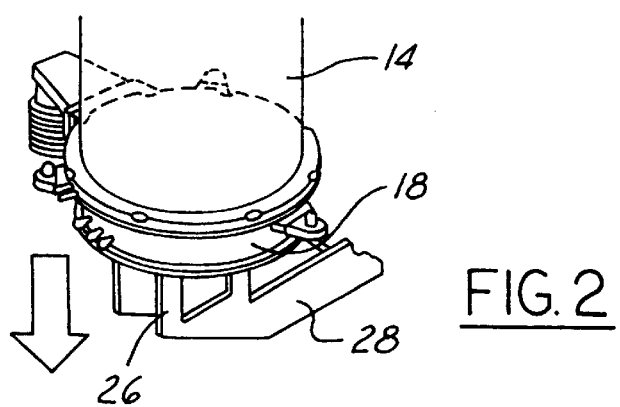
FIG. 2 is an enlarged, fragmentary, perspective view of the lower part of the tube assembly including a tube support arm.
Figure 3:
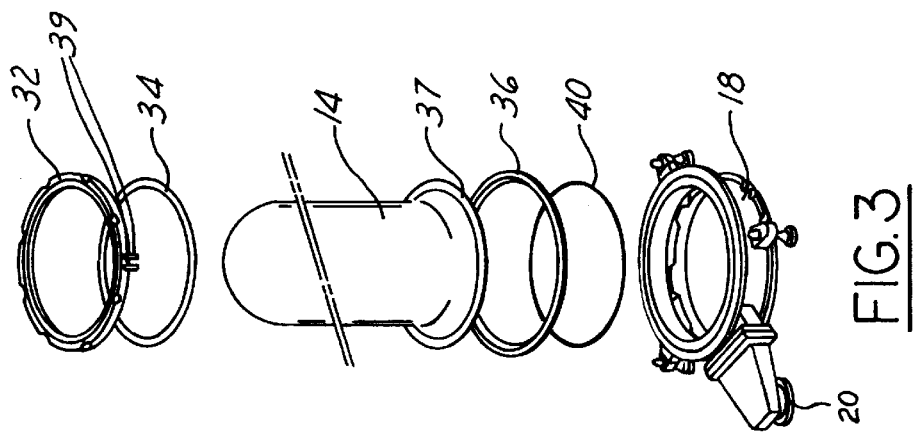
FIG. 3 is an exploded, perspective view of the tube assembly shown in FIG. 2.

Referring first to FIGS. 1–3, the present invention relates to a semiconductor furnace, generally indicated by the numeral 10 employed to carry out processes used in manufacturing semiconductor devices, such as integrated circuits. The furnace 10 is of the so-called vertical type, having a cylindrical heating body 12 provided with a closed upper end, and a lower open end. The body 12 typically would include a plurality of electrical heating elements (not shown) therein coupled with a suitable power source for heating the interior cavity of the body 12 to a temperature of, for example, 180 to 250° C. The lower end of the heater body 12 is provided with a flat metal base 16 having a circular opening in the middle thereon, coaxial with the longitudinal, central axis of the body 12. Either or both of the body 12 and base 16 may be provided with conduits (not shown) therein coupled with a source of cooling water for accelerating the cool down of the furnace, as may be required in certain manufacturing processes.

A processing chamber in the form of a quartz tube assembly generally indicated by the numeral 35 includes a fragile, quartz tube 14 having a generally cylindrically sidewall disposed within the furnace body 12, coaxial with the latter. The tube 14 secured on a base flange 18 by means of a reaction tube anchor ring 32 and cushion ring 34 which are sleeved over the tube 14 so as to engage a lip 37 on the lower end of the tube 14. A Teflon seal-ring 36 and O-ring 40 are sandwiched between the lip 37 and upper surface of the flange 18. The anchor ring 32 is drawn down against the flange 18 by suitable fasteners to create an air tight seal between the tube 14 and flange 18. The flange 18 includes the three circumferentially spaced mounting ears 22 provided with fasteners 24 that secure the base 18, and thus the tube assembly 35, on standoffs 25 that extend downwardly from the base 16. As best seen in FIG. 3, the anchor ring 32 may be provided with an internal, circumferentially extending fluid conduit coupled with inlets/outlets 39 which are in turn coupled with a source of cooling water in order to draw heat away from the tube assembly 35. The flange 18 also includes an inlet opening 20 which is adapted to be coupled with a vacuum pump (not shown) or gas supply for evacuating the tube and filling it with processing gases.

A semiconductor wafer boat elevator 41 includes a boat support 26 coupled by a lateral arm 28 to a vertical spiral drive 30 which moves the elevator up and down, beneath the furnace 12.

In order to remove or install the tube assembly 35 in the furnace body 12, the fasteners 24 are released and the boat elevator 41 is moved upwardly until the flange rests on the support 26. Motor means (not shown) is then activated to lower the boat elevator 41, whereupon the tube assembly 35 moves downwardly through the bottom opening of the furnace body 12. As previously discussed, however, the clearance between the outer sidewall of the tube 14 and the various components of the furnace body 12 and base 16 are very tight, raising the possibility that the tube 14 may contact parts of the furnace 14, thereby resulting in damage or breakage of the tube 14.

Figure 5:
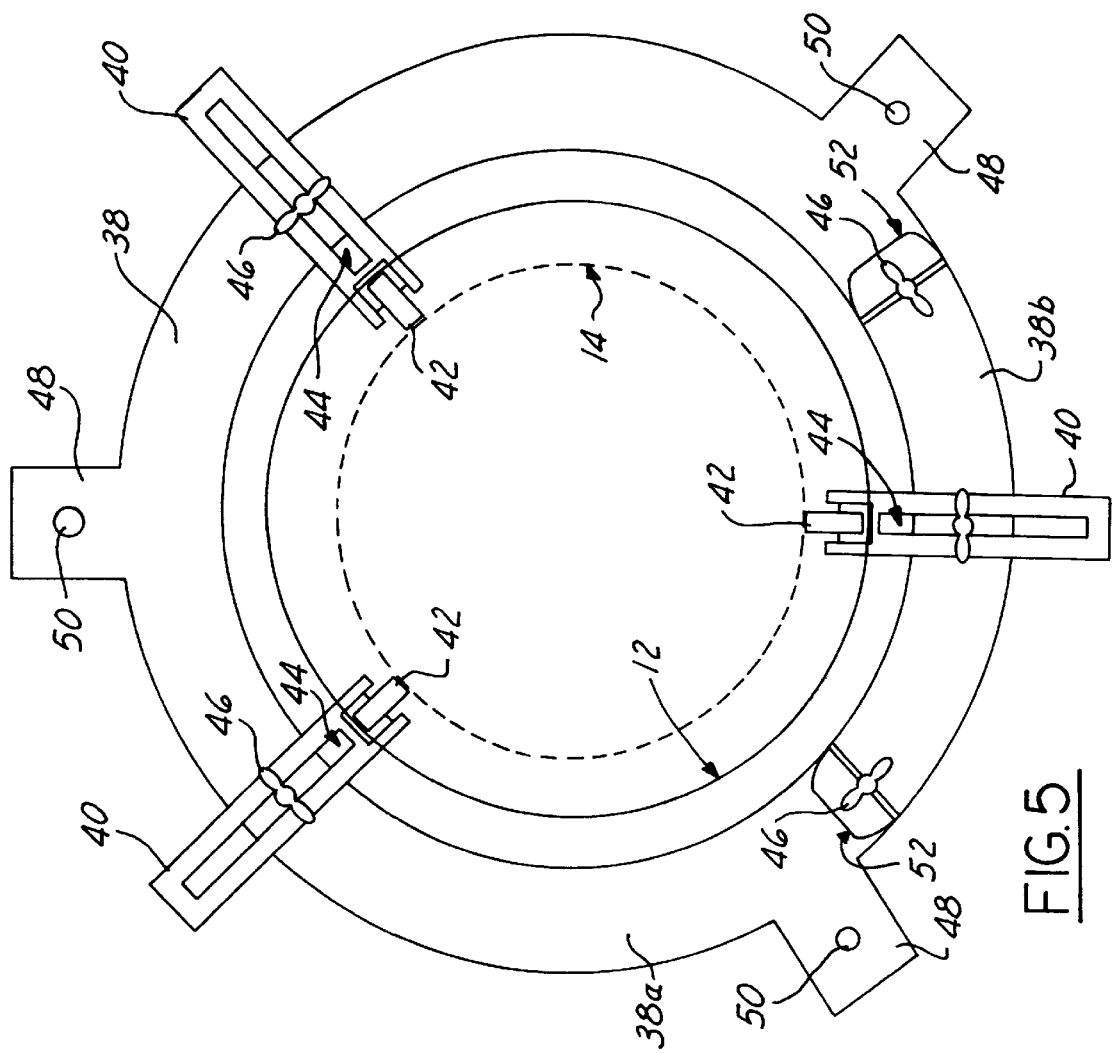
FIG. 5 is a plan view of the apparatus that forms the preferred embodiment of the present invention; and, FIG. 6 is a plan view of an alternate embodiment of the present invention.
Figure 4:
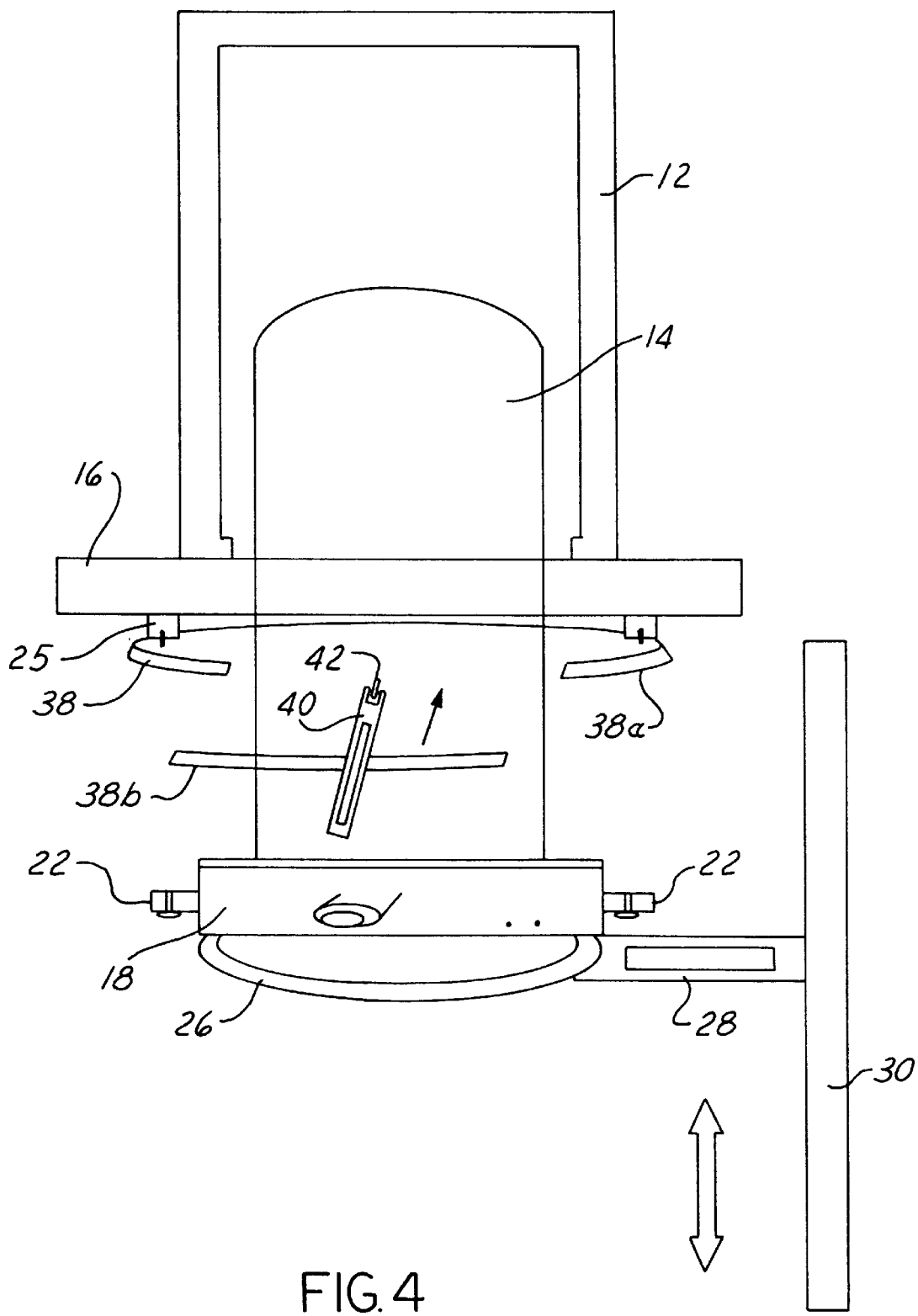
FIG. 4 is a view similar to FIG. 1 but depicting the tube assembly partially lowered from the furnace body, with parts of the apparatus of the present invention installed thereon.
Figure 6:
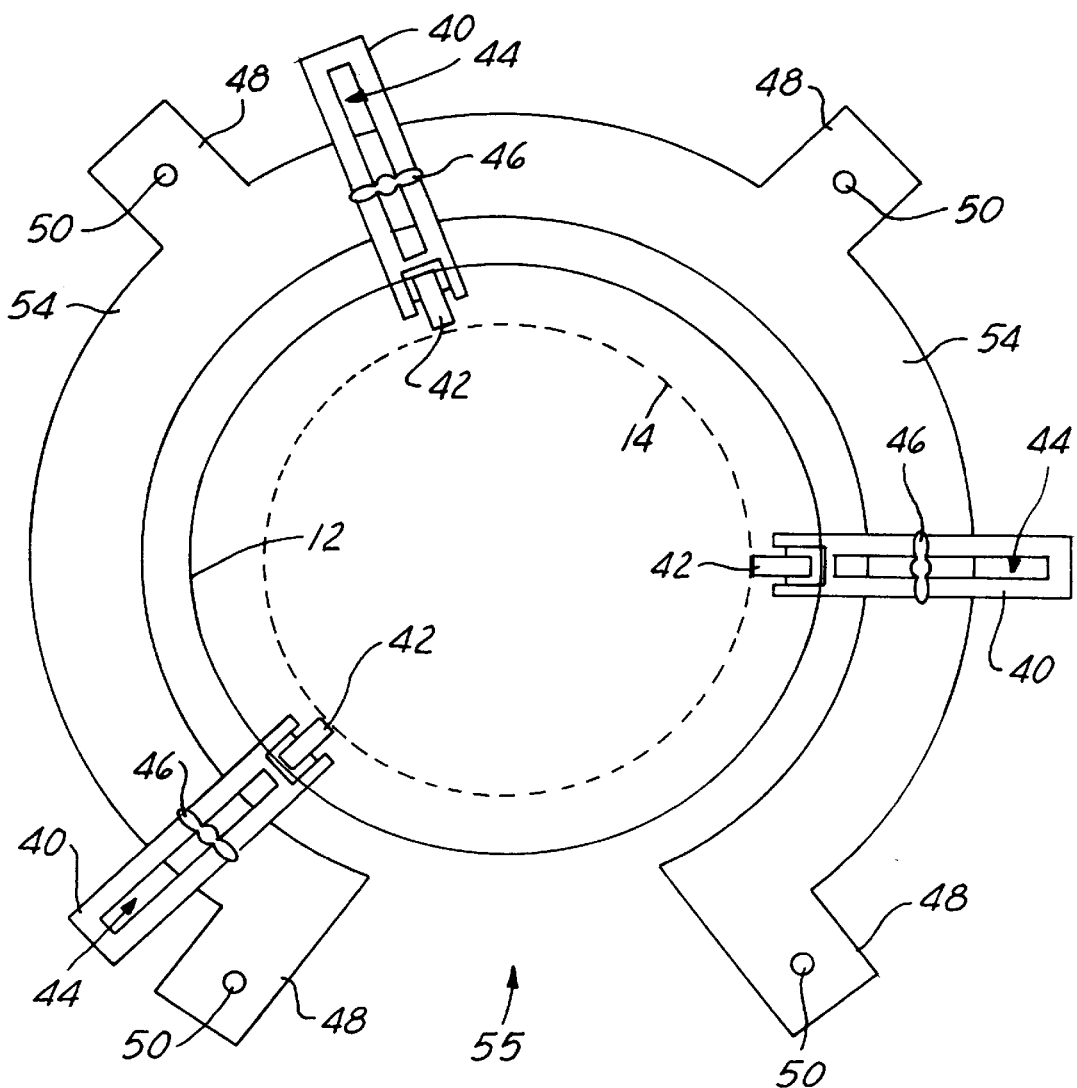

Referring now also to FIGS. 4–6, apparatus is depicted for aiding in the removal of tube assembly 35 from the furnace body 12, which can easily be retrofitted to the existing furnace system, and operated by relatively unskilled technicians. The apparatus includes a plurality of circumferentially spaced guides and means for mounting the guides on the bottom of the base 16. The mounting means includes a ring-shaped plate 38 having three circumferentially spaced ears 48 provided with through holes 50 that permit mounting the ring 38 via fasteners on the standoffs 25. The mounting ring 38 preferably includes first and second portions 38A, 38B interconnected by a tongue and groove interconnection 52, and secured together by fasteners, such as wing nuts 46.

The guides comprise a plurality of rollers 42 journalled for rotation on the inner ends of elongate slides 40 each of which includes an elongate slot 44 therein. A plurality of fasteners extend through the ring 38 and slots 40, and include wing nuts 46 which draw the slides 40 tightly against the ring 38. It may thus be appreciated that loosening of the wing nuts 46 allows radial adjustment of the slide 40, and thus adjustment of the radial position of the rollers 42. Rollers 42 are preferably coated with Teflon so as to withstand the high heat of the furnace 12. The slides 40 are radially adjusted so that the rollers 42 come into to light contact with the sidewall of the tube 14. FIG. 6 depicts an alternate form of the apparatus of the present invention which is generally similar to that shown in FIG. 4, but which includes 4 (rather than 3) of the mounting ears 48, and an opening 55 in one section of the ring designated by the numeral 54.

In use, in order to remove the tube assembly 35 from the furnace body 12, the boat elevator 41 is moved up upwardly so as to contact and support the flange 18. Fasteners 24 are then removed, and the boat elevator 41 is moved downwardly a short distance, for example 200 mm. At this point, the apparatus of the present invention is installed on the base 16 by first removing ring portion 38B and moving the major portion 38A onto the bottom of base 16 by moving the tube 14 laterally through the opening in the ring 38 created by the absence of the smaller portion 38B of the ring. Fasteners 24 are then passed through openings 50 and are secured in standoffs 25 to thereby mount the major portion 38A of the ring on the base 16. Then, the smaller portion 38B of the ring 38 is installed on the major portion 38A, whereupon the wing nuts 46 are tightened to secure the two ring portions 38A, 38B together. Next, wing nuts 46 associated with slides 40 are loosened and the slides 40 are displaced radially inward until the rollers 42 gently touch the outside wall of the tube 14, whereupon the wing nuts 46 are tightened. At this point, it may be appreciated that the rollers 42 engage and guide continued lowing movement of the tube assembly 35, while maintaining longitudinal axis of tube 14 coaxial with that of the tube body 12, and thus maintain a safe spacing between the tube assembly 35 and other components of the furnace assembly during withdrawal of the tube assembly.

In the case of the embodiment shown in FIG. 6, the ring 54 is installed similar to the installation process described above which referenced the embodiment shown in FIG. 5, however, there is no need for final assembly of the ring, since the ring 54 is in a single piece and provides an opening 55 that permits the ring to be manipulated so that the tube 14 passes through the opening 55.

The process of reinstalling the tube assembly 35 is simply opposite the removal procedure described above. The boat elevator is moved upwardly until the flange 18 is spaced a short distance below the base 16. During this upward movement of the tube assembly 35, the rollers 42 engage the sidewall of tube 14, maintaining the tube 14 in proper, safe alignment. When the flange 18 is spaced just below the bottom of the base 16, fasteners 24 are removed and the ring 38 is then removed following which the boat elevator is reactivated to move the tube assembly 35 to its final, raised home position within the first furnace body 12.

From the foregoing it may be appreciated that the present invention would not only provides for the reliable accomplishment of the objects of the invention but does so in a particularly effective and economical manner. It is recognized, of course, that those skilled in the art may make various modifications or additions chosen to illustrate the invention without departing from the spirit and scope of the present contribution of the art. Accordingly, it is to be understood that the protection sought and to be afforded hereby should be deemed to extend to the subject matter claimed and all equivalents thereof fairly within the scope of the invention.

What is claimed is:

1. Apparatus for aiding in the removal of a processing tube from a surrounding furnace, said furnace having a cylindrical body surrounding said tube, an open end through which said tube may be removed from said body, and a base at said open end of said body, comprising:

a plurality of circumferentially spaced guides;

means for mounting said guides on said base for radial movement toward and into engagement with the sidewall of said tube, whereby to guide the longitudinal movement and radial position of said tube during removal of said tube from said furnace body.

2. The apparatus of claim 1, wherein said mounting means includes:

a plate, means for securing said plate on said base; and slide means for slidably mounting said guides on said plate.

3. The apparatus of claim 2, wherein said plate is generally ring shaped and surrounds said open end of said body.

4. The apparatus of claim 3, wherein said roller member includes a layer of Teflon thereon.

5. The apparatus of claim 2, wherein:

said slide means includes a slidable plate having a guide slot therein defining the extent of radial movement of said guide, and said guide includes a roller member mounted for rotation on said slidable plate.

6. The apparatus of claim 2, wherein said plate includes first and second portions releasably interconnected with each other.

7. The apparatus of claim 6, wherein said first portion of said plate includes a tongue thereon and said second portion includes a groove therein for receiving said tongue.

8. The apparatus of claim 2, wherein said plate includes a plurality of ears extending radially outward and said securing means including fasteners fastening said ears to said base.

9. Apparatus for aiding in the removal of a fragile cylindrical tube disposed within a cylindrically shaped furnace body employed to process semiconductor devices, said furnace body including an opening on one end thereof through which said tube may be removed from said furnace body, and a base on said one end of said furnace body, comprising:

a guide assembly for engaging and guiding the movement of said tube as said tube is removed from said furnace body through said one end of said body, said guide assembly includes a plate, a plurality of guide members engaging the sidewall of said tube, and means for mounting said guide members in circumferentially spaced apart relationship on said plate, and means for mounting said guide assembly on said base.

10. The apparatus of claim 9, wherein said guide member mounting means includes a plurality of slides mounted for radial sliding movement on said plate whereby to provide adjustment of the radial position of said guide members relative to said tube sidewall.

11. The apparatus of claim 9, wherein said guide member mounting means includes means for releasably securing said slides in any of a plurality of radial positions of adjustments.

12. The apparatus of claim 11, wherein each of said guide members includes a roller member journalled for rotation on one of said corresponding slides.

13. The apparatus of claim 12, wherein said roller member includes a coating of Teflon thereon.

14. The apparatus of claim 9, wherein said plate includes first and second poritions, and means for releasably connecting said first and second portions.

15. The apparatus of claim 9, wherein:

said plate includes a plurality of mounting ears, and said guide assembly mounting means includes a plurality fasteners for fastening said ears to said base.

16. Apparatus for aiding in the removal of a fragile, cylindrically shaped tube from a semiconductor processing furnace, said furnace being of the type having a cylindrical body possessing an open end through which said tube may be withdrawn, and a base on said open end, and wherein said tube includes a flange secured to said base through which gas may be withdrawn from or introduced into said tube, said tube being coaxially disposed within said furnace body, said apparatus comprising:

a guide assembly for engaging and guiding the movement of said tube as said tube is withdrawn through said open end of said furnace body, said guide assembly includes a ring-shaped plate, a plurality of guide wheels engaging the sidewall of said tube, said guide wheels being circumferentially spaced around said plate, and means for mounting said guide wheels on said plate for radially adjustable movement toward and away from said tube sidewall, and means for mounting said guide assembly between said base and said flange.

17. The apparatus of claim 16, wherein said guide wheel mounting means includes a plurality of slides mounted for sliding movement on said plate, and said guide wheels are rotatably mounted on one end of said slides.

18. The apparatus of claim 16, wherein said plate includes first and second interconnected portions.

* * * * *